United States Patent [19]

Smith

[11] Patent Number: 5,610,368
[45] Date of Patent: Mar. 11, 1997

[54] CLIP PLATE BULKHEAD MOUNTING FOR EMI FILTERS

[75] Inventor: Robert L. Smith, East Springfield, Pa.

[73] Assignee: Spectrum Control, Inc., Fairview, Pa.

[21] Appl. No.: 188,726

[22] Filed: Jan. 31, 1994

Related U.S. Application Data

[63] Continuation of Ser. No. 954,160, Sep. 30, 1992, abandoned.

[51] Int. Cl.$^6$ .................................................... H05K 9/00
[52] U.S. Cl. ................... 174/35 GC; 174/35 R; 174/65 R; 333/182; 333/184
[58] Field of Search .................... 174/35 R, 35 GC, 174/65 R; 333/185, 182, 183, 184; 361/56, 424, 91, 749

[56] References Cited

U.S. PATENT DOCUMENTS

| | | | |
|---|---|---|---|
| 4,152,671 | 5/1979 | Tuma et al. | 174/35 R X |
| 4,212,510 | 7/1980 | Ritchie et al. | 339/147 R |
| 4,276,523 | 6/1981 | Boutros et al. | 333/182 |
| 4,296,390 | 10/1981 | Vanderheyden et al. | 333/182 |
| 4,729,752 | 3/1988 | Dawson, Jr. et al. | 439/620 |
| 4,804,332 | 2/1989 | Pirc | 439/620 |
| 4,884,171 | 11/1989 | Maserang et al. | 361/424 |
| 5,015,802 | 5/1991 | Chi | 174/35 R X |
| 5,191,544 | 3/1993 | Benck et al. | 174/35 R X |
| 5,362,243 | 11/1994 | Huss et al. | 439/76 |

*Primary Examiner*—Kristine L. Kincaid
*Assistant Examiner*—Dean A. Reichard
*Attorney, Agent, or Firm*—Lovercheck and Lovercheck

[57] ABSTRACT

A bulkhead mounting plate for EMI filter units formed along three of its edges into alternating fingers. The fingers can grip the inside and outside surfaced of an edge port or a notch in a box. The plate is shaped by a right angle bend of a fourth edge and perforated with precision mounting holes appropriate to any specified application. Fingers on the mounting plate are dimpled to concentrate spring pressure between them and the box to improve the efficiency of electrical contact of the filter to be mounted on the plate.

10 Claims, 7 Drawing Sheets

CLIP PLATE BULKHEAD MOUNTING FOR EMI FILTERS

This application is a continuation of application Ser. No. 07/954,160, filed Sep. 30, 1992, now abandoned.

BACKGROUND OF THE INVENTION

The interface between compartments in sensitive electronic analog and digital equipment is isolated by shields which are composed of metallic barriers or bulkheads. In a cellular telephone base station transmitter-receiver the digital circuitry is isolated from the transmitter by a metallic bulkheads or partitions. The receiver is isolated from the transmitter and the digital circuitry by other bulkheads or partitions sometimes referred to as shields.

These bulkheads or partitions (shields) are electrically grounded 360 degrees around its peripheral through either being part of a continuous aluminum cast housing with compartments as an integral part of the housing or by metallic fasteners or screws being installed continuously around the bulkhead or partition (shield) edges.

The continuous electrical bond is required to isolate the compartments of such electronic system from one another at high radio frequencies. As electric and magnetic fields are generated within any of the fast digital circuits or high frequency analog circuits a skin current flows around the bulkhead or partition surface of the compartment containing such circuits. Any interruption or gap in this continuous electrical bond, with physical dimensions greater than 0.05 times the wavelength in meters of the operational frequency of the electronic circuit, will cause the skin currents that flow on the inside or interior skin of a bulkhead or partition (shield) to leak through onto the outside or exterior skin of the bulkhead or compartment. This leakage through such interruptions or gaps reduce the radio frequency isolation of adjacent shielded compartments containing electronic circuits that cross couple to other electronic circuits within the same electronic system (intra-system leakage or coupling) or leakage to other entirely physically isolated electronic system (inter-system leakage or coupling) will impair its ability to meet applicable electromagnetic compatibility specifications or operate correctly.

Electronic circuits subject to faulty operation from spurious signals known as "Electro-Magnetic Interference" (EMI) are shieldable from such disturbances if placed in a closed conductive box (Faraday Shield). However, to perform useful functions, electrical power and signals must enter and leave such a box by conductors. This invention is not concerned with the suppression of those spurious signals which are resident on such conductors, but rather with the mountings and circuit mating portions of a number of such special conductors which individually suppress such EMI. To feed needed electrical power and electronic data signals from an outside power source or electronic data source such electrical energy is typically fed through the bulkhead or partition (shields) with low pass electromagnetic interference (EMI) filters. To reduce the purchase cost and installation cost of such EMI filters a technology has evolved whereas two or more EMI filters are preassembled onto a metallic plate. This metal plate herein called a filter plate is mechanically mounted to a pre-machined or cast hole in the bulkhead or partition. The low pass filters permit the power, signal and data signals to pass from outside power and data sources to within the system or pass from compartment to compartment within the system.

Presently filter plates have been built using entirely flat plates for installation of the EMI filters. When these entirely flat plates are mounted to a bulkhead or compartment using established fasteners or screws the number of mounting points is usually limited to two (one on each end of a filter plate) or one every inch to one and one half inch mounting centers. As the filter plates are manufactured out of rolled steel or brass or any other ferrous or non-ferrous metal and machining stamping or drilling holes disturbs the flatness of the filter plate stock material, an inherent weaknesses results as follows: The grounding or contact between the filter plate and the bulkhead or partition (shields) are not continuous around the peripheral. It is been established that for a radio frequency isolation between compartments of greater than 80 db (a current or voltage ratio of 10,000 to one) that an electrical contact point must be made around the perimeter of the filter plate to the bulkhead or partition at points closer than 0.05 times the wavelength in meters. As an example, 0.05 times 0.3 meters (1000 Megahertz=0.015 meters or 15 millimeters (0.6 inches). The design of such special conductors incorporates concentric assemblies on the wire leads of standard pi, L, or feed thru filters consisting of a possibly ferrite inductor and ceramic capacitors, which filter and suppress such spurious signals, (ocasionally some simple feed-thrus with only capacitive filtering of spurious signals may be used, as well as other means of interior/exterior communication such as RF shielded cable connectors, secondary ground wires, insulated pins, or insulated non-filtered pins). In particular, the invention is concerned with the method of attaching such an assembly to a port in the shielding box which will more effectively seal the internal circuits in the box from ambient EMI signals. Said pi or L filters and feed-thrus are standard products and would normally be individually mounted in separate ports in the shielding box, and must then be connected to the box by low impedance means such as soldering if they are to be effective.

By use of the features shown in the drawings, the number of minute individual/continuous grounding points or electrical contact points between the compartments or the bulkhead (shield) and outside of the system are increased to a value much less than 0.05 times the wavelength which is less than 0.6 inches at 1 GHZ.

Therefore, the isolation between the compartments is increased electrically to a value of greater than 80 db.

In the case where insufficiently points exist, the grounding or contact degraded isolation is caused by the increased shielding impedance of the filter plate due to the lack of continuous connection all the way around the filter plate. In the case of the clip filter plate, the individual fingers make grounding contact around the periphery of the filter plate to the chassis on the finger sides. The folded side is contacted to a lid installed over the clip filter plate thus completing the 360 degree contact around the filter plate. In the case of the coined filter plate, the coining stiffens and straightens the flatness of the rolled material filter plate. Therefore, a more continuous ground connection is made to the mating bulkhead or partition (shield). This technique will also facilitate the same feature as the clip plate i.e. with electrical contact made between the filter plate and the bulkhead or partition and points less than 0.05 times the wavelength therefore improving the shielding between compartments to greater than 80 db.

PATENT LITERATURE CONCERNING EMI FILTERS

It should be noted that no claim will be made concerning the internal structure of the pi filters, L filters, and feed-thrus which are mounted on the bulkhead plates which are the subject of this patent. The age of the concept was indicated when the closed conductive box was characterized as a Faraday Shield. U.S. Pat. No. 928,204 deals with shielding boxes, multiple leads, and some filtering of EMI resident on those leads. However, it is not until U.S. Pat. No. 4,827,180 that the concept of protection from ambient EMI appears in the patent literature, and that patent is not concerned with multiple leads. Essentially, the components and structure of the multiple filter units which are mounted on the bulkhead clip-plate which is the subject of this patent are those disclosed in U.S. Pat. No. 4,700,156, the assigned property of Spectrum Control, except that the external flange sleeve 36 shown there, is not needed or used because of improved assembly methods developed for the bulkhead clip-plate.

During the eighty-one year interval between these patents technology has recognized the possibilities of all of the basic elemental materials which are processed to form all the various portions of the now standard EMI pi filter units. The central wire lead is a special composition chosen for its conductivity and its dimensions are such that its coefficient of thermal expansion is compatible with that of the ferrite ring inductor which is the central part of such a pi filter. The capacitors which are the legs of the pi filter are several silver patterns bonded to a high dielectric constant ceramic tube. The solders which bond the interior capacitor patterns to the wire lead are special compositions whose melting point is higher than that used to bond the exterior pattern to the bulkhead mounting plate, so that a soldering temperature controlled by vapor phase soldering does not soften a previous joint formed by a higher melting point composition. Even the preferred beryllium copper sheet used to form the bulkhead mounting plate has been developed during this interval.

Why are there no significant EMI patents detailing this development in the appropriate Class 307/91? The developments have been many, but in no case have they been specifically directed toward EMI structures, and consequently there is no reference to Class 307/91 associated with them. Like Topsy, EMI filters just grew. But the precision mounting of multiple EMI filters in a manner suitable for automatic assembly which will also exclude ambient EMI is a definite invention resulting from inspiration and perspiration.

SUMMARY OF THE INVENTION

Increasing complexity of circuits greatly increases the number of such feed-thru pi or L filters (or feed-thrus), so efficient economic considerations dictate their automated pre-assembly into a unit which may be easily and automatically assembled with the box by low impedance connection means. The invention resides in the shape of this unit, a plate which is formed so that preferably three edges of the plate become fingers which alternately grip the interior and exterior sides of the box at the port and the fourth edge bent to stiffen the plate. To achieve the essential low impedance connection to the box, it is necessary to achieve high spring pressure in the fingers, together with excellent conductivity. The choice of the bulkhead material is thus dictated by these considerations, and is best suited by a beryllium copper alloy, which can be formed in the soft condition and hardened by a suitable heat treatment. But it is not intended to limit the invention to this material, since other materials such as brass and spring steel may be plated to provide perhaps adequate contact between the fingers and the box.

A second object of the invention is that such a factory assembled unit will have standard spacing of both the interior and exterior leads of the EMI filters, and may therefore be connected to both the interior and exterior circuits by any of a number of standard flat cable termination sockets. An alternative connection which has been used adapts the filter leads for flush mounting on a printed circuit board. Such precision assembly is seldom attained by field mounting of the filter units into individual ports. It should be noted that such standard spacing results in extremely narrow lands between the adjacent ports which receive the feed-thrus, and therefore factory precision is quite mandatory.

A third object of the invention is to minimize the leakage of ambient EMI past the bulkhead plate. This requires that the spacing between the fingers along the edges of the bulkhead plate be a minimum. This object is preferably attained by the use of a special slitting and forming die which shears the fingers apart while at the same time bending the internal fingers down at right angles with the plate to the predetermined depth required by the thickness of the box wall. Simpler dies require the initial removal of some material between the fingers before forming the fingers. This is a less acceptable configuration which has been used previously.

The preferred form, FIG. 1, of such a bulkhead plate is suitable for mounting in a notch in the edge of an open box which will be closed by a mating lid, but in certain instances it may be necessary that the bulkhead assembly be installed in a round or oval hole in a wall of the box. Consequently, a second alternative form such as that shown in FIG. 6 or FIG. 7 may be required. It is an adaptation of the quite standard hole plug which is inserted and retained in an unwanted hole in a connection box by spring fingers. The necessary modifications are mandated by the necessary low impedance connection between the bulkhead plate and the shielding box if the pi and/or feed-thru filters are to be effective.

DESCRIPTION OF THE PREFERRED EMBODIMENT

Figure 1:
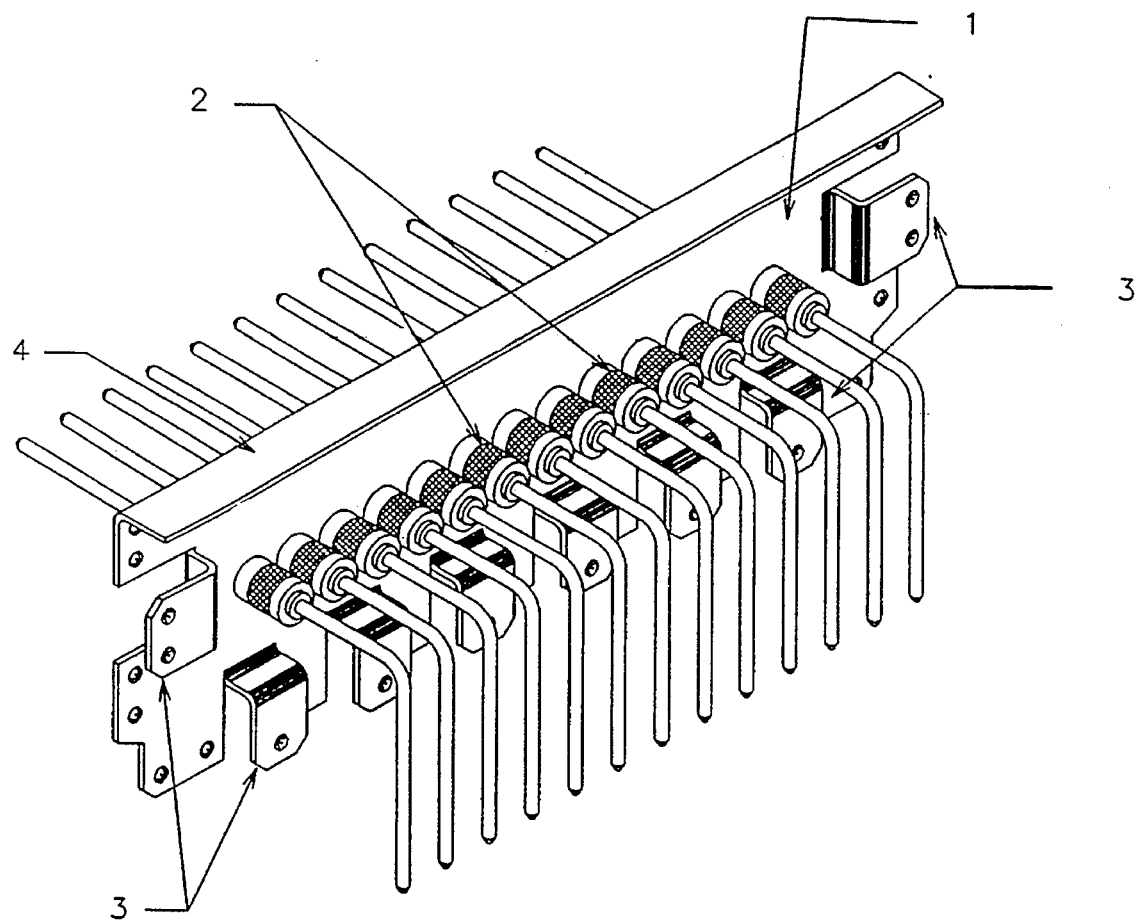
FIG. 1 is a perspective view of a bulkhead mounting plate.

A preferred embodiment of the invention is shown in FIG. 1 which is a perspective view of the bulkhead mounting plate with a number of Standard EMI pi filters mounted on it. Note that three of the edges have been formed into fingers which can alternately grip the interior and exterior edges of the box at an edge port in it. The fourth edge is bent inward and serves to stiffen the bulkhead plate. 1 is the bulkhead plate or closure, with a number of pi or L filters 2, mounted on it. Three edges of the plate have been formed into alternating fingers 3, by right angle bends of one set, to provide a finger depth spacing determined by the wall thickness of the box. It should be noted that there is little to no spacing between the fingers in the edgewise direction. They are formed in a compound slitting and bending die which may not remove any edge material between them. Consequently, they exhibit an almost solid obstacle to ambient EMI, which is an important consideration in many circuits at frequencies where the interference is not confined to the metallic core conductors of the EMI filters.

Figure 2:
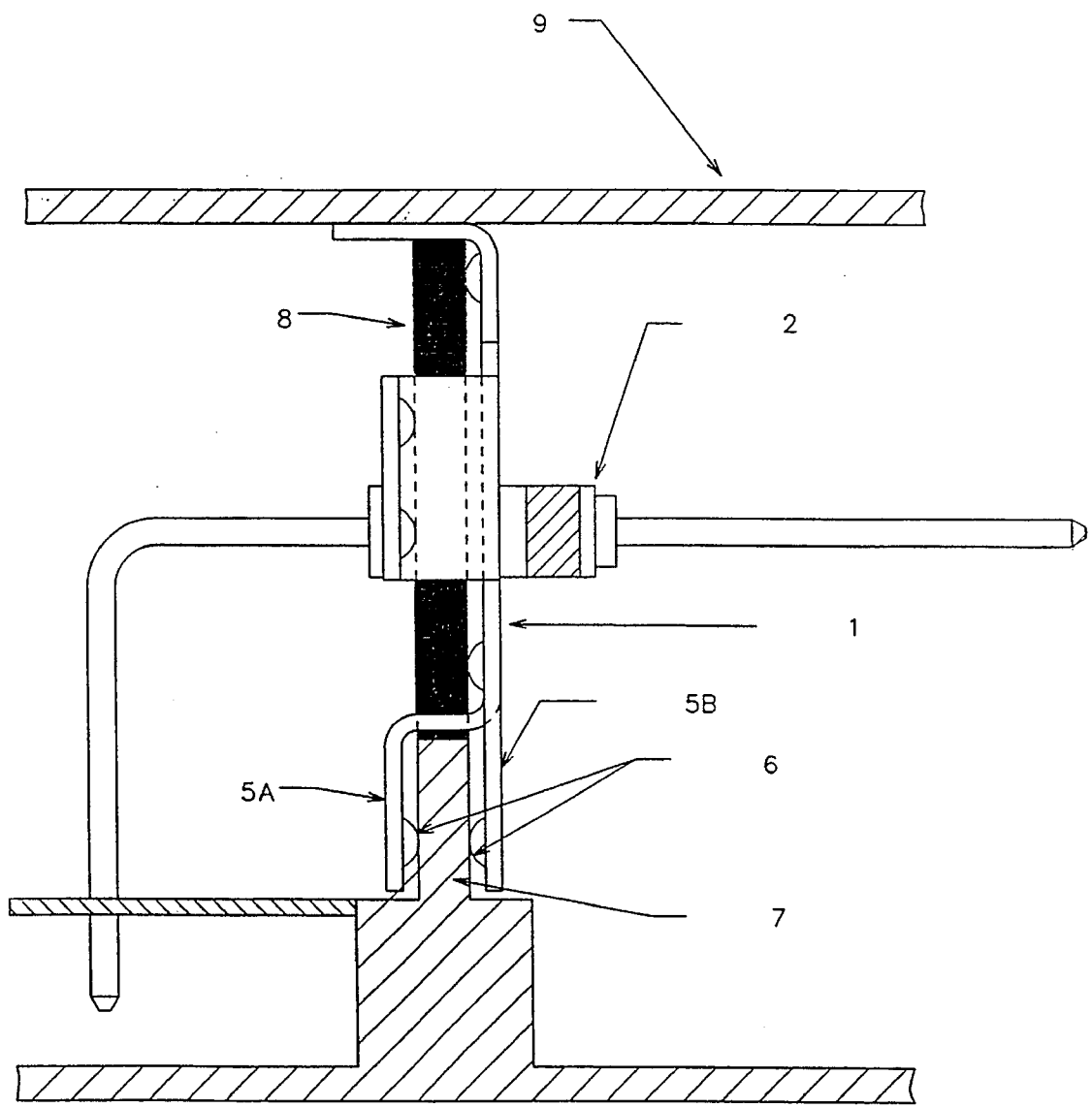
FIG. 2 is an enlarged drawing of the side view of a pair of the interior and exterior fingers.
Figure 3:
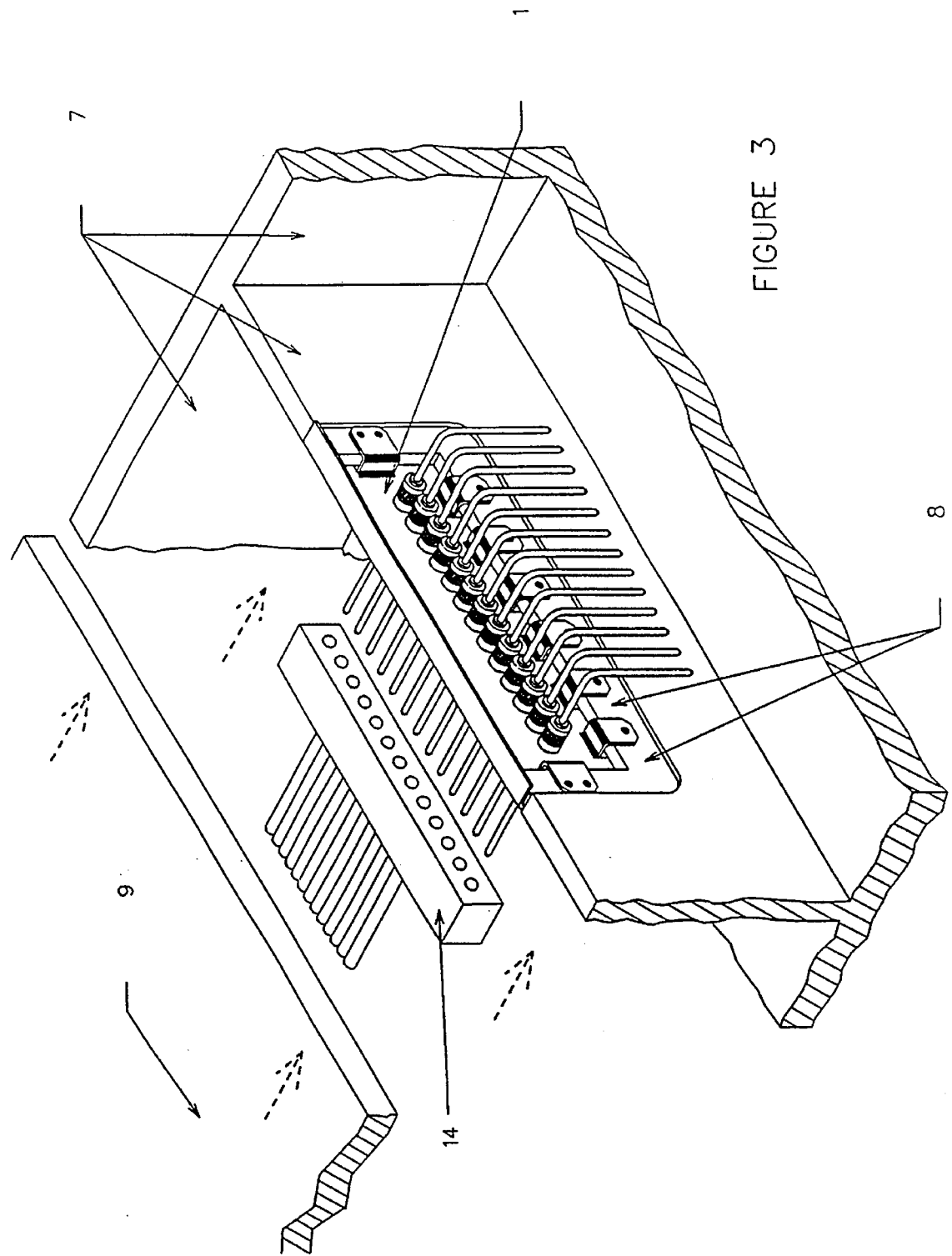
FIG. 3 is a perspective view of a portion of a box according to the invention.

FIG. 2 is an enlarged drawing of a side view of a pair of the interior and exterior fingers that are formed along three of the edges of the bulkhead mounting plate. Note the right angle bends of the interior fingers and the opposed dimpling of both sets of fingers. showing the right angle bends and the dimpling 6 of the fingers 3 to produce increased pressure of their contact with the box. Interior finger 5A and exterior finger 5B are formed along three of the edges of bulkhead mounting plate 1. Note the right angle bends of interior fingers 5A and opposed dimpling 6 of both sets of fingers 5A, 5B. It is to be noted that this arrangement permits sliding insertion of the assembly into a notch or port in the edge of the box 7, and the cover of the box 9, then completes the shielding closure. This fourth side of the bulkhead is here folded inwards to stiffen the bulkhead plate, but it could alternatively be provided with fingers also, to grip a lip of the cover 9, as shown in FIG. 3. Alternate fingers on this fourth side would be set by right angle bends opposite those on the first three sides, and thus engage the cover lip. Other shapes are possible, and are not excluded.

FIG. 3 is a perspective view of a portion of the box with inserted in the port and the closure to be completed by the lid of the box. Any of a number of standard flat cable termination sockets which will mate with the filter leads by reason of their standard spacing. Present U.S. practice is usually one tenth of an inch spacing.

Figure 4:
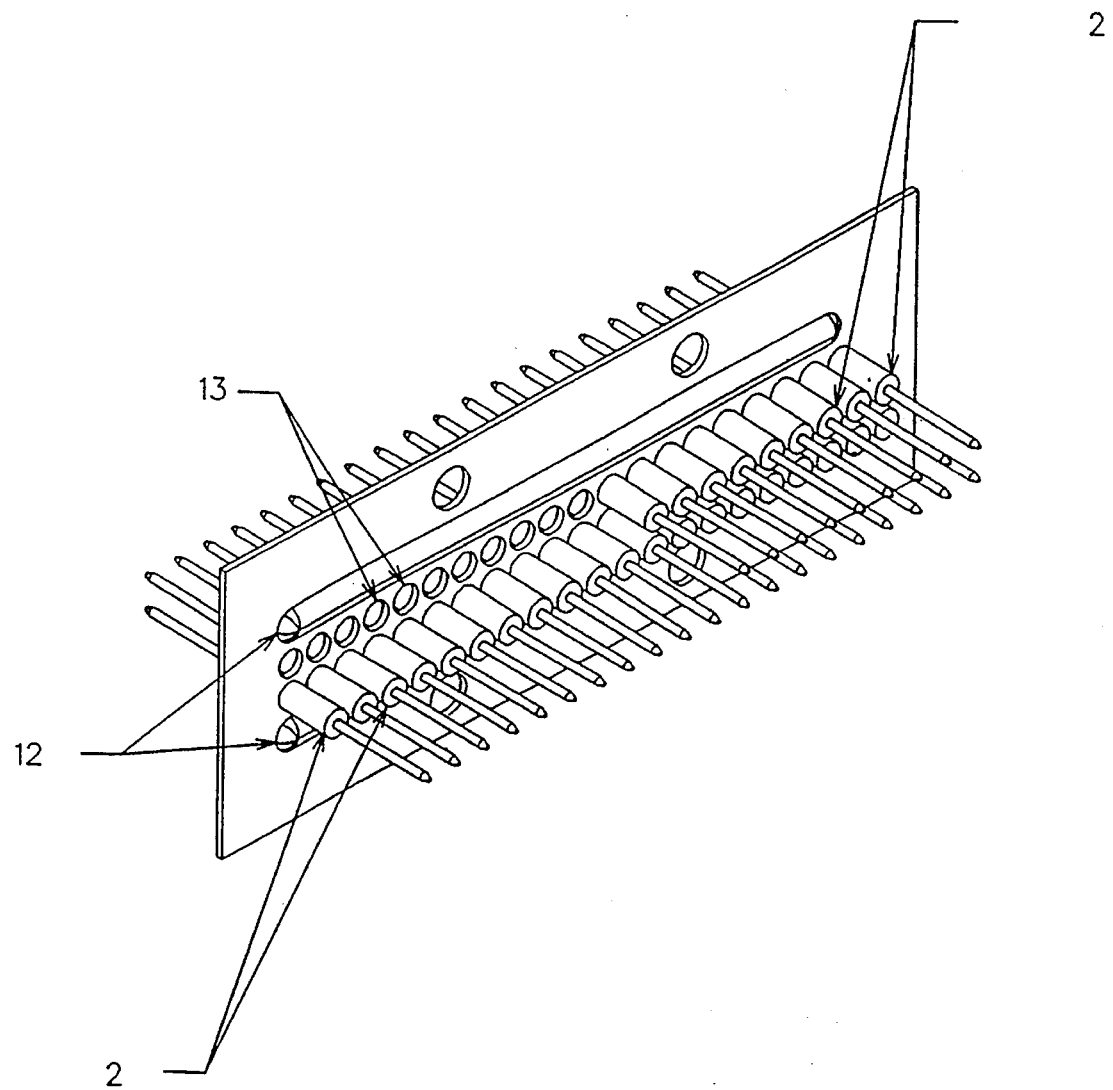
FIG. 4 is a perspective view of the center portion of another embodiment of the bulkhead mounting plate.

FIG. 4 is a perspective view of the center portion of another style of bulkhead mounting plate without fingers which has been stiffened by embossing a rib parallel with the ports in which the EMI filters, of FIG. 1, will be mounted. The embossing will stiffen the plate and hold the plate flat so that it will make electrical contact with the box continuously around the periphery of an opening in the box. Note that a double row of filters is shown here for applications requiring many signal paths. Several filters have been omitted from the upper row to show the close spacing of the ports. It should be noted that stiffening of the plate by embossing or coining as discussed concerning FIG. 4 and FIG. 5 would be particularly desirable if the fourth edge is provided with fingers to grip the box lid, since the intermittent structure of such fingers will not provide the stiffening action of the full bent lip of FIG. 1.

Figure 5:
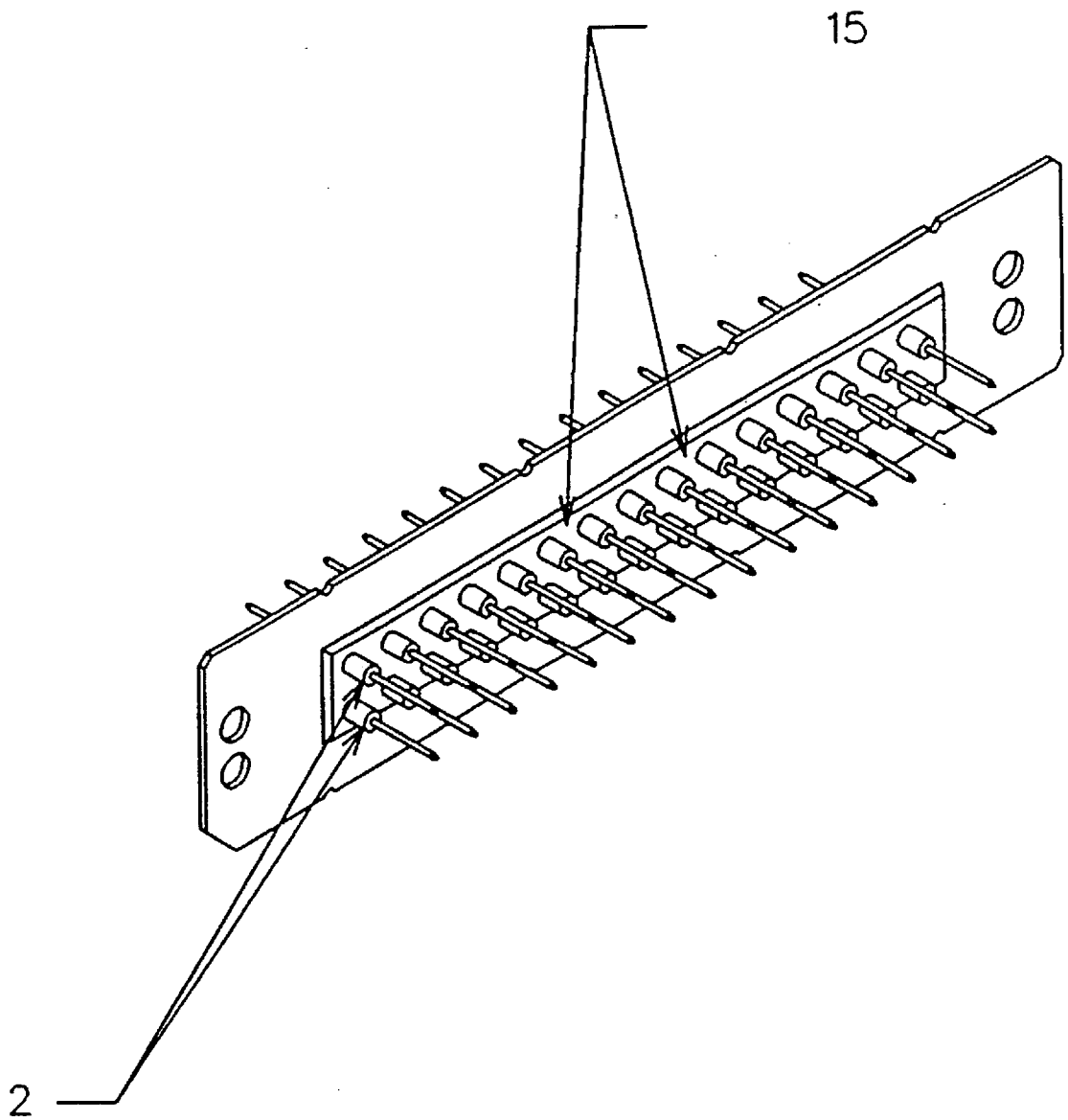
FIG. 5 is a perspective view of the center portion of another embodiment of a bulkhead mounting plate.

FIG. 5 is a perspective view of the center portion of another style of a bulkhead mounting plate which has been stiffened by coining the surface about the area in a box in which the EMI filters are mounted. The coining will hold the plate in electrical contact with the box continuing around the periphery of the opening in the box.

Figure 6A:
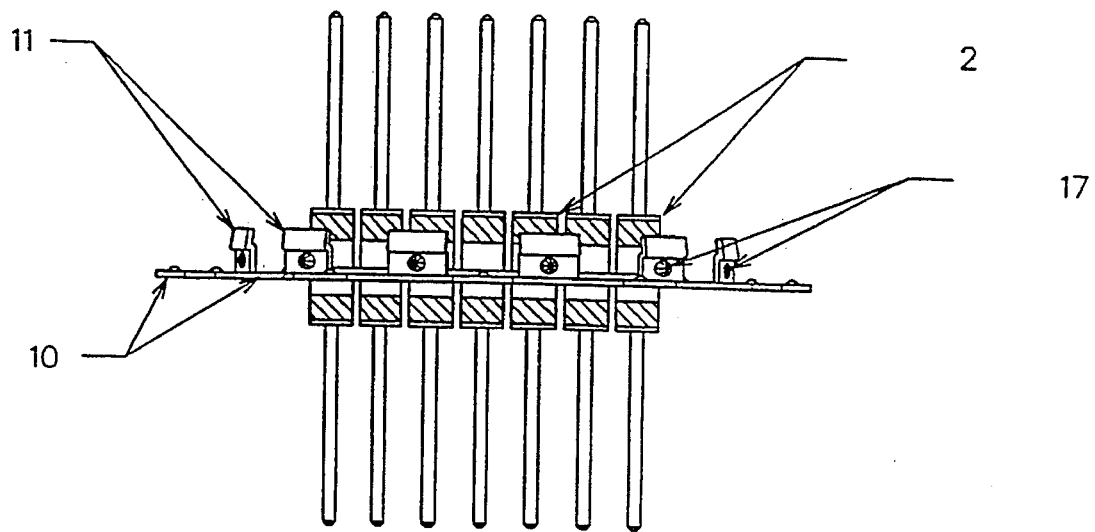
FIG. 6A is a cross sectional view taken on line 6A—6A of FIG. 6B.
Figure 6B:
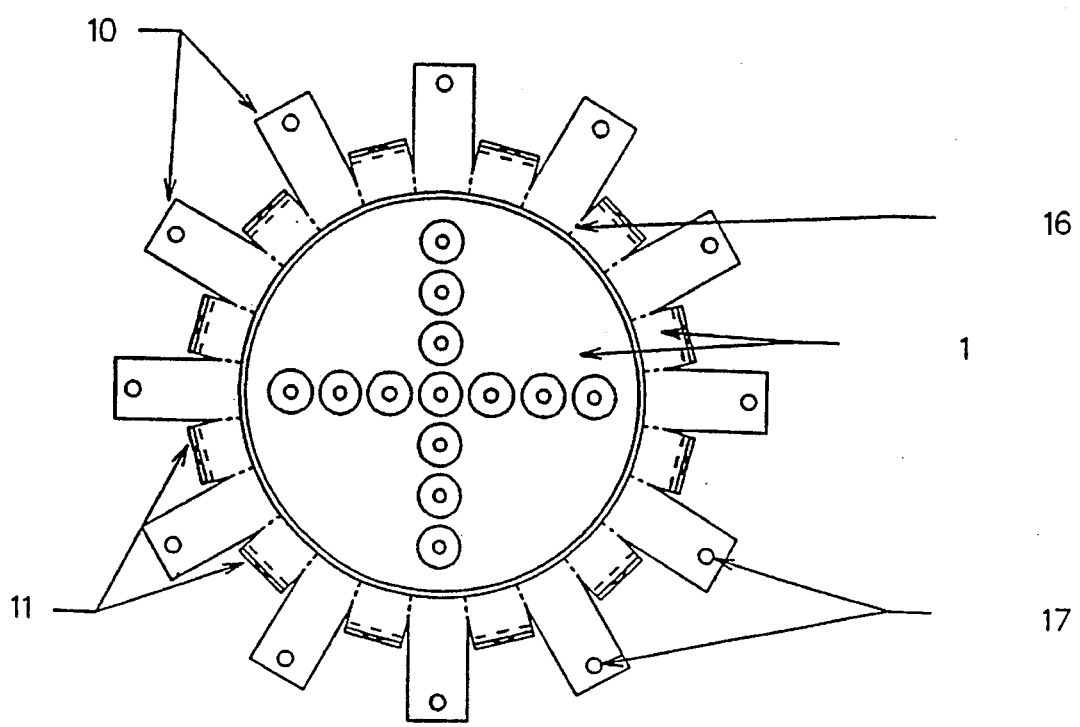
FIG. 6B is a side view of another embodiment of the bulkhead plate.

FIG. 6 is a side and top view of an alternate form of the bulkhead plate suitable for insertion in a round hole punched in a side of the shielding box. Note that the entire periphery consists alternately of fingers which enter the hole and fingers which contact the surface of the shielding box in which it will be mounted. The slitting operation which separates the fingers extends somewhat into the central area of the plate to make the fingers more flexible for insertion into the punched hole of thicker shielding boxes. Such additional slitting is indicated by the dotted lines. Note also the dimpling of all the fingers which produces greater spring pressure under the dimples between the fingers and the box and consequently insures lower resistance at the contacts.

Figure 7A:
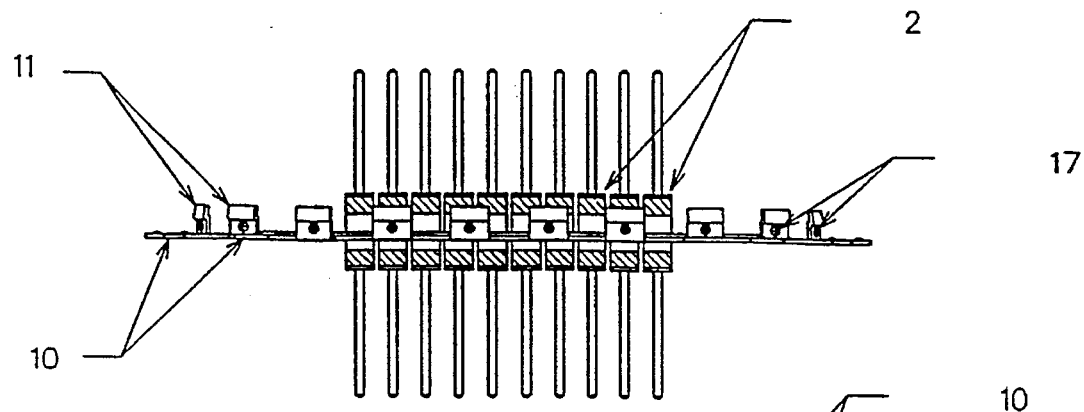
FIG. 7A is a cross sectional view of another embodiment of the invention.
Figure 7B:
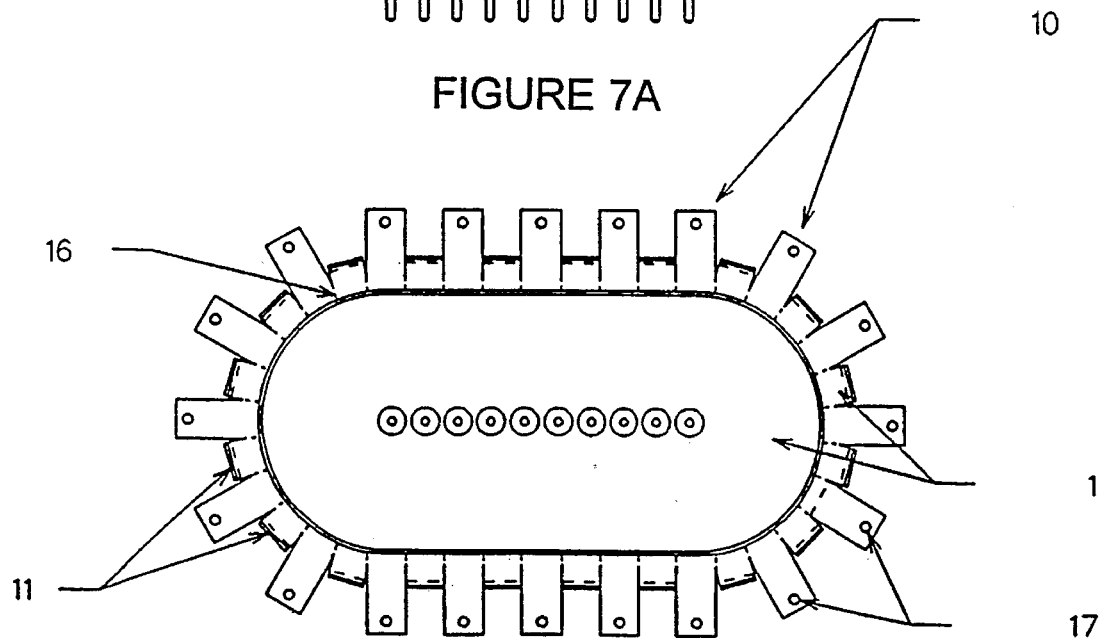
FIG. 7B is a side view of a second embodiment of the bulkhead plate.

FIG. 7 is a side and top view of a second alternate form of the bulkhead plate suitable for insertion in an oval hole punched in a side of the shielding box. This form would be preferred to a round hole when the number of feed-thrust is large and consequently the flexural strength of a large round plate might be insufficient to resist damage to the solder joints of the feedthrust on the bulkhead plate or even damage to the filters themselves.

The flexural strength of any of the modifications disclosed may be increased in several ways: an embossed rib paralleling the ports, as in FIG. 4; an embossed coined raised area at the ports, similar to FIG. 5; or by an additional flat plate attached to the bulkhead plate by rivets or solder.

The primary form of the invention is inserted in a notch in one of the top edges of a shielding box, but there are also possible designs of the internal circuitry which require that the bulkhead plate deliver its leads to the internal circuits at some point far from a lip of the box. To accomplish this, several alternate forms, circular or oval, as shown in FIG. 6 and FIG. 7 are required.

These are also formable from a flat sheet, and their periphery is divided into a number of fingers alternately either left in the plane of the bulkhead or bent at right angles to it so that they form a close fit with the mating hole punched in a side or bottom of the shielding box. While this configuration resembles a standard hole plug, it differs due to the required low resistance between the box and the bulkhead plate. The inner ends of the fingers which enter the hole in the box must form a latching detent with the inner surface of the box, and at the same time their ends must have a taper lead to make possible the initial entry of these fingers into the mating hole in the box.

These fingers must have sufficient flexibility to permit them to bend inward far enough to reduce the circumference of their detent portions to less than that of the hole in the box. And this flexing must not exceed the elastic limit of the finger material, or they would not spring back and engage their detent lips with the inner surface of the box. This requirement establishes an upper limit on the thickness of the bulkhead plate material, and also a lower limit on the wall thickness of the box. A thicker box will require longer fingers, which will be subject to less strain during insertion.

Thus it is quite apparent that the bulkhead material must be quite thin for proper spring action in these fingers, so that the center portion of the bulkhead plate where the feed-thrus are mounted will require stiffening by one of the methods outlined in the discussion of FIG. 4 or FIG. 5.

The fingers of these alternate forms will also require dimpling to ensure low resistance between plate and box. The flat fingers should be dimpled far from the hole periphery to take advantage of the spring action of those fingers, but the dimpling of the fingers which enter the hole should preferably not be on the surfaces within the hole, but should be dimpled on the detent ledge. Actually, the most effective method of dimpling those fingers is to bend the edges of the detent portion slightly up towards the plate.

What I claim is:

1. A bulkhead mounting plate having a plurality of electromagnetic interference (EMI) filter units mounted therein;

said bulkhead mounting plate having a first edge, a second edge, a third edge and a fourth edge;

said bulkhead mounting plate having fingers integrally attached to said first edge, said second edge and said third edge;

said fingers attached to said second edge being first alternate fingers and second alternate fingers;

said second alternate fingers being bent so that a gap is disposed between said first alternate fingers and said second alternate fingers;

said first alternate fingers and said second alternate fingers being adapted to receive and grip inside and outside surfaces of edges of an edge port or notch in a shielding box;

said edges of said edge port or notch in said shielding box being substantially the same thickness as the width of said gap;

said bulkhead mounting plate being stiffened by folding said fourth edge inwardly at a right angle to said bulkhead mounting plate;

said bulkhead mounting plate being perforated with precision mounting holes adapted to be used for a particular application;

said fingers being dimpled to concentrate spring pressure between said fingers and said shielding box to improve the electrical contact and, therefore, the efficiency of said EMI filter units;

predetermined spacing for said mounting holes between said EMI filter units to be mounted on said bulkhead mounting plate for flat ribbon cable terminations and connectors to connect external and internal portions of a circuit through said EMI filter units;

a rib embossed in said bulkhead mounting plate parallel to said EMI filter units thereby increasing resistance to filter and solder joint damage by flexure of said bulkhead mounting plate.

2. For multiple EMI filter units, a bulkhead mounting plate perforated with precision spaced ports appropriate to a predetermined circuit application, and whose periphery is divided into a number of alternate fingers, half of which are bent to fit within a mating port, in a shielding box, and are further bent with a latching ledge conforming to wall thickness of the shielding box, and taper inward below the latching ledge to permit easy automatic insertion into the mating port in the shielding box.

3. A bulkhead mounting plate as specified in claim 2 and provided with mounted EMI filters precision spaced so that their interior and exterior leads are compatible with a predetermined flat ribbon cable termination and associated sockets.

4. A bulkhead mounting plate as specified in claim 2 and provided with mounted EMI filters whose precision spaced filter leads are bent in a method that terminates in a manner capable of being mounted on a printed circuit board.

5. A bulkhead mounting plate, as specified in claim 3, whose unbent fingers are dimpled toward the bent fingers, and the edges of the latching ledge of said bent fingers are bent slightly upward, so that the dimples and bent edges combine to increase the contact pressure between the bulkhead plate and the shielding box to ensure the continuous electrical contact which is required for proper functioning of the EMI filters.

6. A bulkhead mounting plate, as specified in claim 5 formed of thin spring stock to prevent permanent deformation of the fingers.

7. A bulkhead mounting plate, as specified in claim 6 which is stiffened by embossing a portion of the plate adjacent to the filters.

8. A bulkhead mounting plate, as specified in claim 5 which is stiffened by coining.

9. A bulkhead mounting plate, as specified in claim 6 which is stiffened by the addition of a small second plate on said mounting plate.

10. The plate recited in claim 2 which is stiffened by a rib attached to said plate.

* * * * *